(12) United States Patent
Choi et al.

(10) Patent No.: US 10,707,253 B2
(45) Date of Patent: Jul. 7, 2020

(54) IMAGE SENSOR

(71) Applicant: SAMSUNG ELECTRONICS CO., LTD., Suwon-si (KR)

(72) Inventors: Wonchul Choi, Suwon-si (KR); Min Jang, Hwaseong-si (KR); Yitae Kim, Hwaseong-si (KR); Heegeun Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 59 days.

(21) Appl. No.: 15/837,497

(22) Filed: Dec. 11, 2017

(65) Prior Publication Data

US 2018/0190692 A1 Jul. 5, 2018

(30) Foreign Application Priority Data

Dec. 29, 2016 (KR) .......................... 10-2016-0182660

(51) Int. Cl.
*H01L 27/146* (2006.01)
*H04N 5/374* (2011.01)
*H04N 5/3745* (2011.01)

(52) U.S. Cl.
CPC .... *H01L 27/1463* (2013.01); *H01L 27/14614* (2013.01); *H01L 27/14621* (2013.01); *H01L 27/14627* (2013.01); *H01L 27/14645* (2013.01); *H04N 5/374* (2013.01); *H01L 27/14636* (2013.01); *H04N 5/3745* (2013.01)

(58) Field of Classification Search
CPC ........... H01L 27/1463; H01L 27/14643; H01L 27/14612; H01L 27/14636; H01L 27/14621; H01L 27/14689; H01L 27/1461; H01L 27/14665; H01L 27/14605; H01L 27/1464; H04N 5/374; H04N 5/3745
USPC ........... 257/292, 225, 432, E31.11, E31.127; 438/73
See application file for complete search history.

(56) References Cited

U.S. PATENT DOCUMENTS

| | | | |
|---|---|---|---|
| 8,558,336 B2 | 10/2013 | Su et al. | |
| 8,710,619 B2 | 4/2014 | Kawamata et al. | |
| 2011/0037133 A1 | 2/2011 | Su et al. | |
| 2012/0049318 A1 | 3/2012 | Kawamata et al. | |
| 2012/0153418 A1* | 6/2012 | Nakadate | H01L 27/14605 257/432 |
| 2012/0199894 A1 | 8/2012 | Furuya et al. | |
| 2014/0239362 A1 | 8/2014 | Koo et al. | |
| 2014/0346628 A1 | 11/2014 | Okazaki | |
| 2015/0295005 A1 | 10/2015 | Tseng et al. | |
| 2015/0372031 A1 | 12/2015 | Yoon et al. | |

(Continued)

FOREIGN PATENT DOCUMENTS

KR 10-0730469 B1 6/2007

*Primary Examiner* — Mouloucoulaye Inoussa
(74) *Attorney, Agent, or Firm* — Sughrue Mion, PLLC

(57) ABSTRACT

An image sensor includes a semiconductor substrate having first and second surfaces facing each other and a first device isolation layer provided in the semiconductor substrate. The first device isolation layer defines pixel regions of the semiconductor substrate and includes first and second portions crossing each other. The first and second portions are provided to surround one of the pixel regions, and the first portion is provided to extend from the first surface of the semiconductor substrate toward the second surface and to have a structure inclined relative to the first surface.

19 Claims, 14 Drawing Sheets

(56) References Cited

U.S. PATENT DOCUMENTS

| | | | |
|---|---|---|---|
| 2015/0372036 A1* | 12/2015 | Suh | H01L 27/1462 348/273 |
| 2015/0373255 A1 | 12/2015 | Kim et al. | |
| 2016/0056198 A1* | 2/2016 | Lee | H01L 27/14612 257/225 |
| 2016/0079288 A1* | 3/2016 | Choi | H01L 27/1463 438/70 |

* cited by examiner

IMAGE SENSOR

CROSS-REFERENCE TO RELATED APPLICATION

This application claims priority from Korean Patent Application No. 10-2016-0182660, filed on Dec. 29, 2016, in the Korean Intellectual Property Office, the entire disclosure of which is hereby incorporated by reference.

BACKGROUND

The present disclosure relates to an image sensor, and in particular, to a complementary metal-oxide semiconductor (CMOS) image sensor.

An image sensor is a semiconductor device that converts optical images into electrical signals. With the development of the computer and communications industries, there is an increased demand for high performance image sensors in a variety of applications such as digital cameras, camcorders, personal communication systems, gaming machines, security cameras, micro-cameras for medical applications, and/or robots.

The image sensors may be generally classified into charge coupled device (CCD) and complementary metal-oxide semiconductor (CMOS) image sensors. The CMOS image sensors are operated using a simple operation method and are configured to have signal processing circuits integrated on a single chip, and thus, it is possible to realize products including scaled CMOS image sensors. In addition, CMOS image sensors may operate with relatively low consumption power, and thus, they are applicable to portable electronic devices. Furthermore, the CMOS image sensors may be fabricated using CMOS fabrication techniques, which may reduce manufacturing costs. Moreover, the CMOS image sensors may provide high resolution images. Accordingly, the use of CMOS image sensors is being increased.

SUMMARY

One or more exemplary embodiments provide an image sensor with improved optical characteristics.

According to an aspect of an exemplary embodiment, an image sensor may include a semiconductor substrate having a first surface and a second surface facing each other; and a first device isolation layer which is provided in the semiconductor substrate to define pixel regions of the semiconductor substrate, and includes a first portion extending in a first direction and a second portion extending in a second direction, the first and second directions crossing each other. The first and second portions are provided to surround one of the pixel regions, and the first portion is provided to extend from the first surface of the semiconductor substrate toward the second surface and to have a structure inclined relative to the first surface.

According to an aspect of an exemplary embodiment, an image sensor may include a semiconductor substrate having a first surface and a second surface facing each other; and a first device isolation layer provided in the semiconductor substrate to define pixel regions of the semiconductor substrate, and having a portion which surrounds one of the pixel regions, extends from the first surface toward the second surface, and has a structure inclined in a radial direction from a center of the semiconductor substrate.

According to an aspect of an exemplary embodiment, an image sensor includes a semiconductor substrate having a first surface and a second surface opposing one another and pixel regions formed between the first and second surfaces; and a first device isolation layer which extends in the semiconductor substrate between the first and second surfaces and defines the pixel regions by surrounding each of the pixel regions, the first device isolation layer having a portion having a sidewall which is inclined toward the first surface and whose angle of inclination with respect to the first surface is less than 90°.

DETAILED DESCRIPTION

Figure 1:
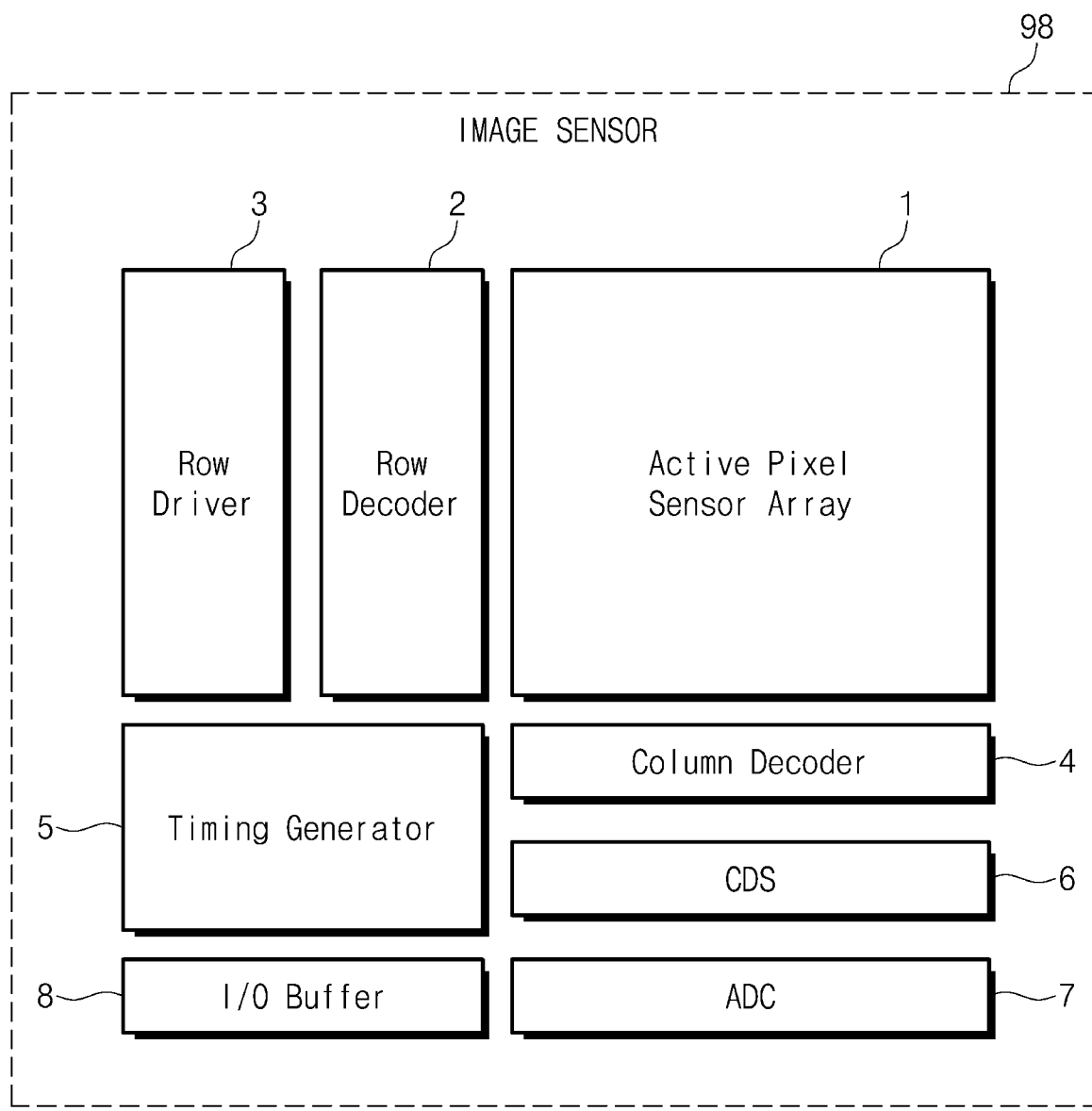
FIG. 1 is a block diagram illustrating an image sensor, according to an exemplary embodiment.

FIG. 1 is a block diagram illustrating an image sensor, according to an exemplary embodiment.

Referring to FIG. 1, an image sensor 98 according to an exemplary embodiment may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of unit pixels that are arranged two-dimensionally and are used to convert optical signals to electrical signals. The active pixel sensor array 1 may be driven by a plurality of driving signals, such as a pixel selection signal, a reset signal, and a charge transfer signal, which are transmitted from the row driver 3. The converted electrical signal may be provided to the CDS 6.

In some exemplary embodiments, the image sensor may be configured to detect a difference in phase of light to be incident into the active pixel sensor array 1 and to perform an auto focusing operation using the phase difference detection. Each of the unit pixels of the active pixel sensor array 1 may be configured to generate and output a focus signal from a difference in phase of light to be incident into a pair of photoelectric conversion devices. The focus signal may be used to perform the auto-focusing operation or to adjust a position of a lens of an imaging device.

The row driver 3 may be configured to provide the driving signals for driving the plurality of unit pixels to the active pixel sensor array 1, based on the result decoded by the row decoder 2. In the case where the unit pixels are arranged in a matrix shape, the driving signals may be supplied to respective rows of the unit pixels.

The timing generator 5 may be configured to provide timing and control signals to the row decoder 2 and the column decoder 4.

The correlated double sampler 6 may be configured to receive the electric signals generated in the active pixel sensor array 1 and perform a holding and sampling operation on the received electric signals. For example, the CDS 6 may perform a double sampling operation using a specific noise level and a signal level of the electric signal and then output a difference level corresponding to a difference between the noise and signal levels.

The ADC 7 may be configured to convert analog signals, which correspond to the difference level output from the CDS 6, into digital signals, and then to output the converted digital signals to the I/O buffer 8.

The I/O buffer 8 may be configured to latch the digital signal and to sequentially output the latched digital signals to an image signal processing unit (not shown), based on the result decoded by the column decoder 4.

Figure 2:
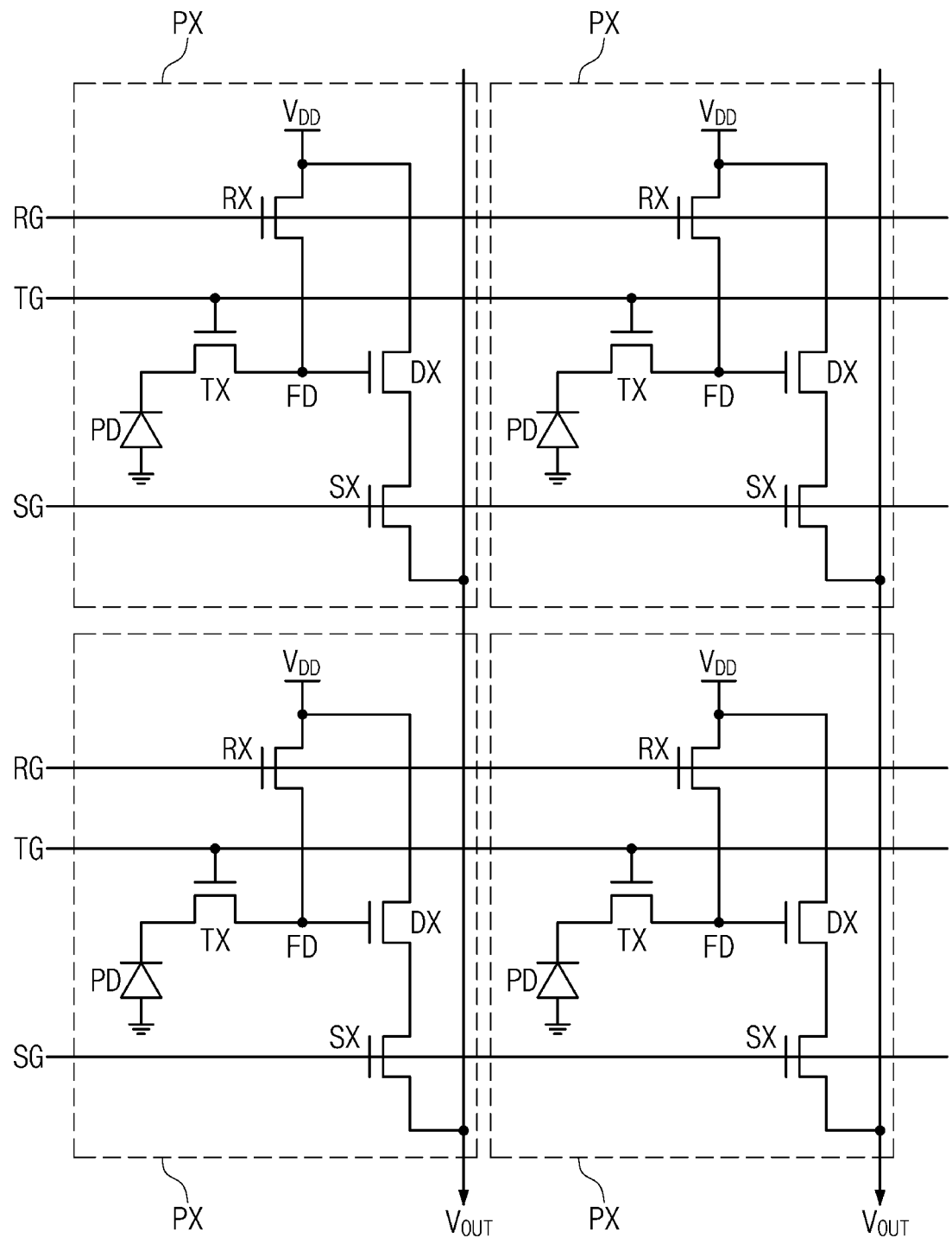
FIG. 2 is a circuit diagram of an active pixel sensor array of an image sensor according to an exemplary embodiment.

FIG. 2 is a circuit diagram of an active pixel sensor array of an image sensor according to an exemplary embodiment.

Referring to FIGS. 1 and 2, the active pixel sensor array 1 may include a plurality of unit pixels PX, which are arranged in a matrix shape. Each of the unit pixels PX may include a transfer transistor TX and logic transistors RX, SX, and DX. The logic transistors may include a reset transistor RX, a selection transistor SX, and a drive transistor DX. The transfer transistor TX may include a transfer gate TG. Each of the unit pixels PX may further include a photoelectric conversion device PD and a floating diffusion region FD.

The photoelectric conversion device PD may be configured to generate and hold photocharges whose amount is in proportional to an amount of light to be incident therein. The photoelectric conversion device PD may include a photo diode, a photo transistor, a photo gate, a pinned photo diode, or any combination thereof. The transfer transistor TX may be configured to transfer electric charges, which are generated in the photoelectric conversion device PD, to the floating diffusion region FD. The charges generated in the photoelectric conversion device PD may be transferred to and stored in the floating diffusion region FD. The drive transistor DX may be controlled by an amount of the photocharges to be stored in the floating diffusion region FD.

The reset transistor RX may be configured to periodically discharge the photocharges stored in the floating diffusion region FD. The reset transistor RX may include a drain electrode, which is connected to the floating diffusion region FD, and a source electrode, which is connected to a power voltage VDD. When the reset transistor RX is turned on, the power voltage VDD may be applied to the floating diffusion region FD through the source electrode of the reset transistor RX. Accordingly, the electric charges stored in the floating diffusion region FD may be discharged through the reset transistor RX, thereby rendering the floating diffusion region FD to be in a reset state.

The drive transistor DX may serve as a source follower buffer amplifier. The drive transistor DX may be used to amplify a variation in electric potential of the floating diffusion region FD and output the amplified signal to an output line Vout.

The selection transistor SX may be used to select each row of the unit pixels PX for a read operation. If the selection transistor SX is turned on, the power voltage VDD may be applied to a drain electrode of the drive transistor DX.

Figure 3:
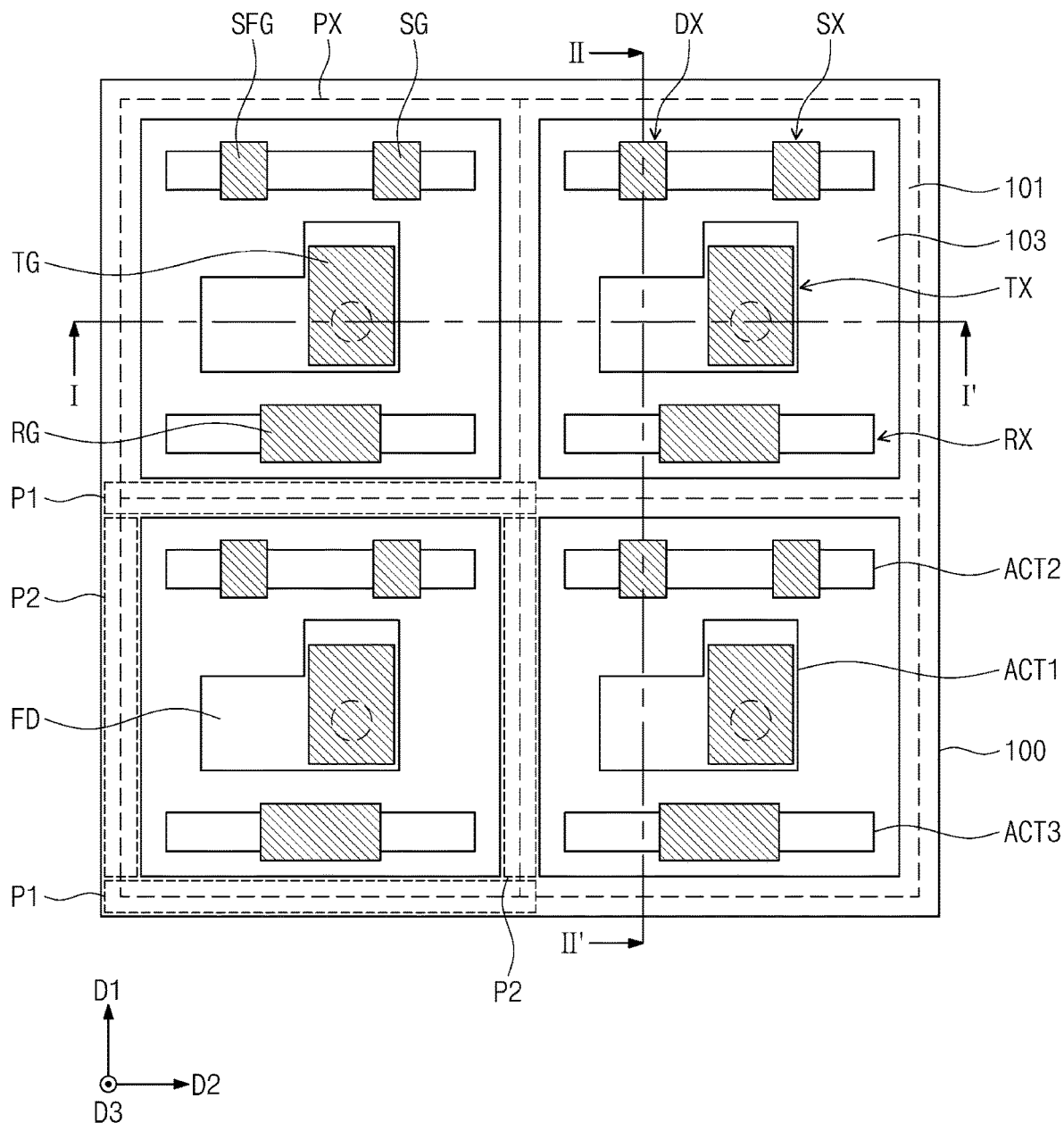
FIG. 3 is a plan view illustrating an image sensor according exemplary embodiments.
Figure 4A:
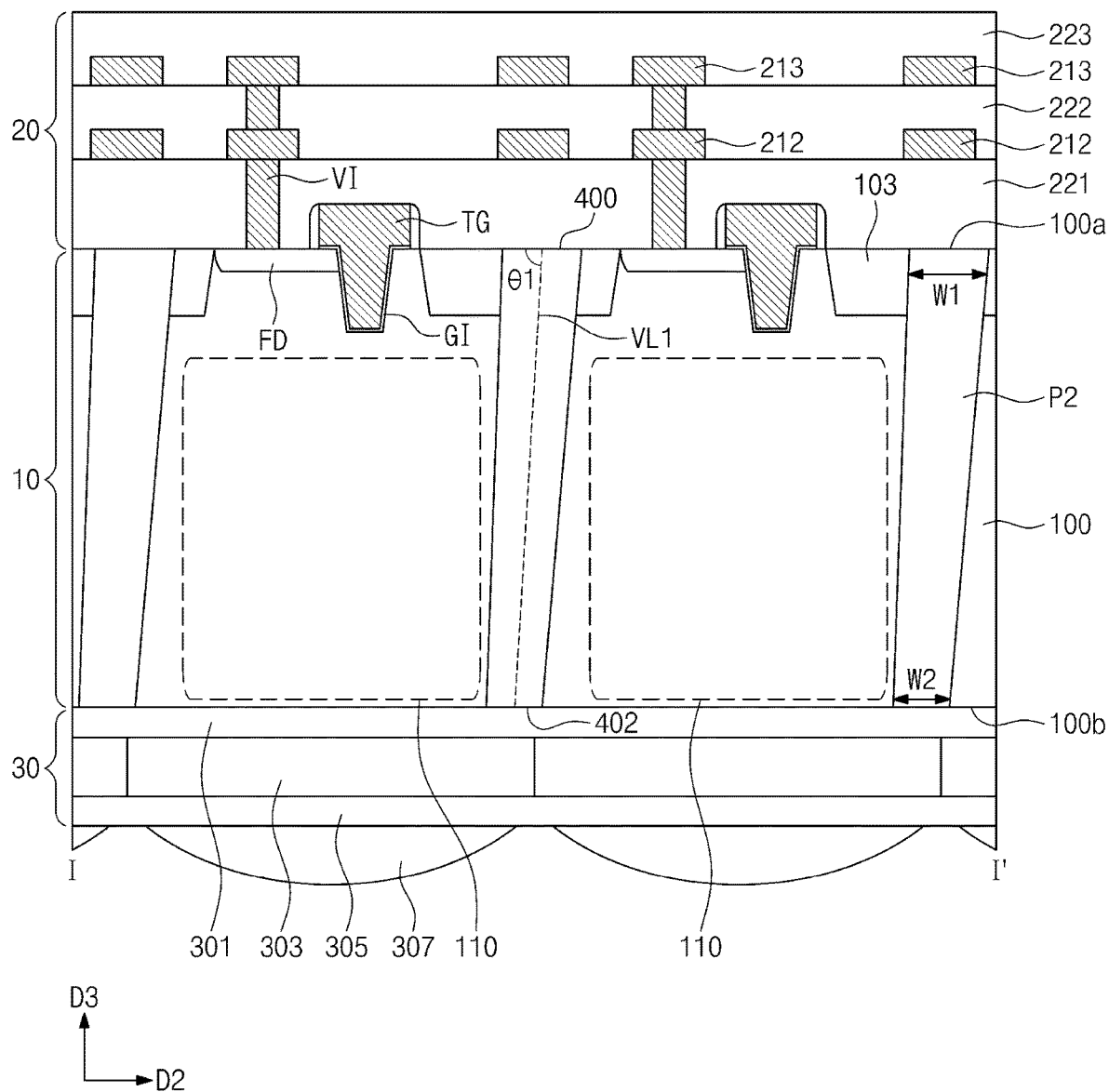
FIGS. 4A and 4B are sectional views taken along lines I-I' and II-II', respectively, of FIG. 3.
Figure 4B:
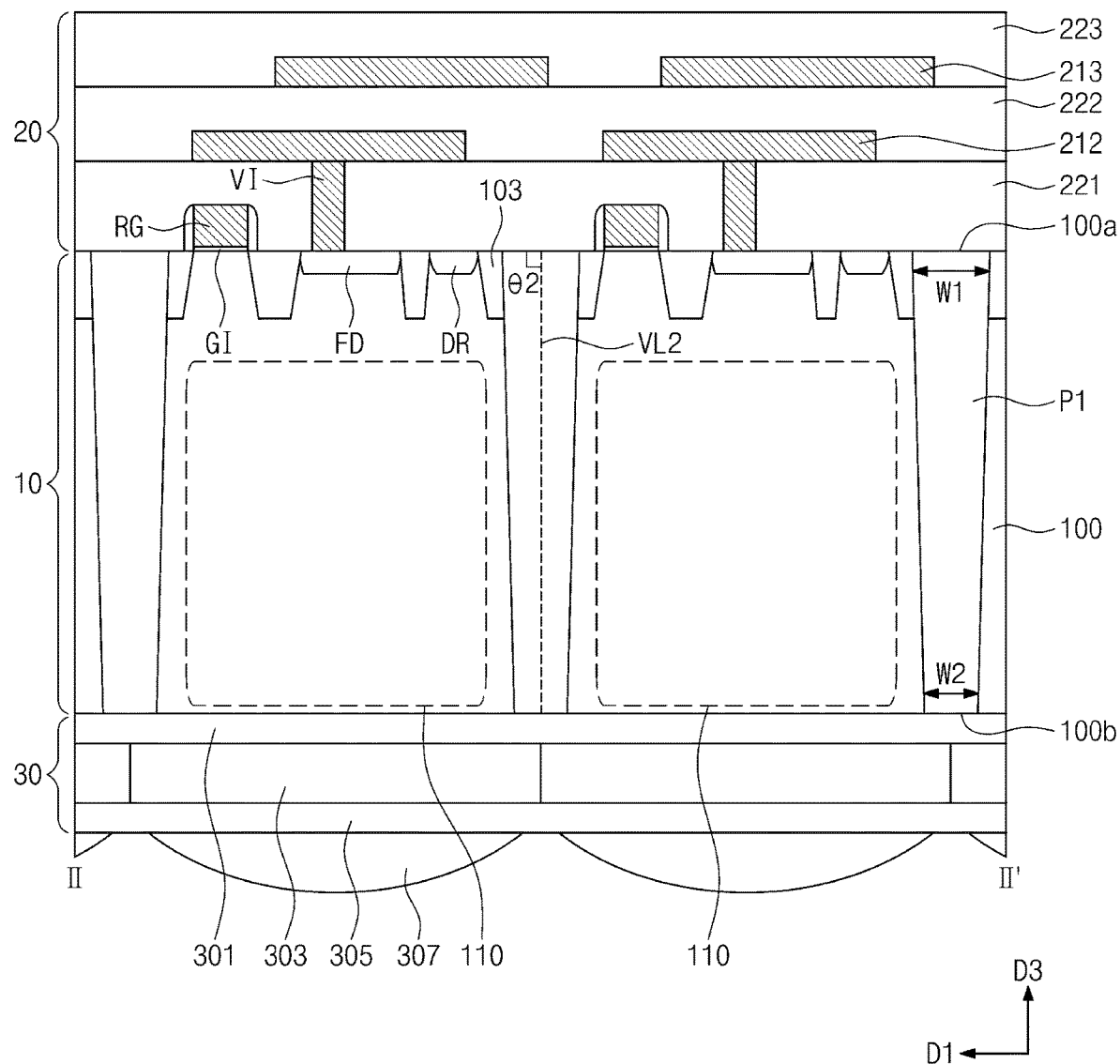

FIG. 3 is a plan view illustrating an image sensor according to exemplary embodiments. FIGS. 4A and 4B are sectional views taken along lines I-I' and II-II', respectively, of FIG. 3.

Referring to FIGS. 3, 4A, and 4B, an image sensor may include a photoelectric conversion layer 10, an interconnection layer 20, and an optically-transparent layer 30. When viewed in a vertical sectional view, the photoelectric conversion layer 10 may be disposed between the interconnection layer 20 and the optically-transparent layer 30. The photoelectric conversion layer 10 may include a semiconductor substrate 100 and a photoelectric conversion region or regions 110, which are provided in the semiconductor substrate 100. The photoelectric conversion regions 110 may be configured to convert light, which is incident from the outside, to electrical signals.

The semiconductor substrate 100 may include a bulk silicon wafer and an epitaxial layer thereon, and in some exemplary embodiments, the bulk silicon wafer and the epitaxial layer may have a first conductivity type (e.g., p-type). In certain exemplary embodiments, the bulk silicon wafer may be removed during a process of fabricating the image sensor, and in this case, the p-type epitaxial layer may be used as the semiconductor substrate 100. In certain exemplary embodiments, the semiconductor substrate 100 may be a bulk semiconductor wafer, in which a well of the first conductivity type is formed. Various kinds of substrates (e.g., an n-type epitaxial layer, a bulk silicon wafer, and a silicon-on-insulator (SOI) wafer) may be used as the semiconductor substrate 100.

The semiconductor substrate 100 may include a plurality of pixel regions PX that are defined by a first device isolation layer 101. The pixel regions PX may be arranged in first and second directions D1 and D2 crossing each other or in a matrix shape. The first device isolation layer 101 may be configured to prevent photocharges from being moved from one of the pixel regions PX to neighboring ones of the pixel regions PX through a random drift phenomenon. In other words, the first device isolation layer 101 may be configured to prevent a cross-talk phenomenon from occurring among the pixel regions PX.

When viewed in a plan view of FIG. 3, the first device isolation layer 101 may be provided to surround each of the pixel regions PX, completely or partially. For example, the first device isolation layer 101 may include first portions P1, which are extended in the second direction D2 and are spaced apart from each other in the first direction D1, and second portions P2, which are extended in the first direction D1 and are spaced apart from each other in the second direction D2. The first portions P1 and the second portions P2 together form a boundary surrounding an outer region of each of the pixel regions, respectively, and each of the pixel regions PX may be defined by a pair of the first portions P1 and a pair of the second portions P2.

The first device isolation layer 101 may be formed of or include an insulating material, whose refractive index is lower than that of the semiconductor substrate 100 (e.g., silicon). The first device isolation layer 101 may include one or more insulating layers. For example, the first device isolation layer 101 may be formed of or include at least one of a silicon oxide layer, a silicon oxynitride layer, or a silicon nitride layer.

The semiconductor substrate 100 may have a first or top surface 100a and a second or bottom surface 100b facing each other. The transfer transistors TX and the logic transistors RX, SX, and DX may be provided on the first surface 100a of the semiconductor substrate 100. The interconnection layer 20 may be provided on the transfer transistors TX and the logic transistors RX, SX, and DX, and the optically-transparent layer 30 may be provided on the second surface 100b of the semiconductor substrate 100.

A second device isolation layer 103 may be provided adjacent to the first surface 100a of the semiconductor substrate 100 to define first active patterns ACT1, second active patterns ACT2, and third active patterns ACT3. When viewed in a plan view, the first device isolation layer 101 may be overlapped with a portion of the second device isolation layer 103. The second device isolation layer 103 may be formed of or include at least one of a silicon oxide layer, a silicon oxynitride layer, or a silicon nitride layer.

Each of the pixel regions PX may include the first active pattern ACT1, the second active pattern ACT2, and the third active pattern ACT3. The first active pattern ACT1, the second active pattern ACT2, and the third active pattern ACT3 may be provided to be spaced apart from each other and may have at least two different sizes. The first active pattern ACT1 may be provided between the second active pattern ACT2 and the third active pattern ACT3.

When viewed in a plan view of FIG. 3, the first active pattern ACT1 may be placed at a center region of the pixel region PX and may have an L-like shape. Each of the second and third active patterns ACT2 and ACT3 may be placed at an edge region of the pixel region PX and may have a line shape extending in the second direction D2. However, shapes of the first to third active patterns ACT1, ACT2, and ACT3 are not limited to those shown in FIG. 3.

The interconnection layer 20 may include wires or conductive material 212 and 213. The transfer transistors TX may be electrically connected to the photoelectric conversion regions 110. The wires 212 and 213 may be vertically connected to the transfer transistors TX and the logic transistors RX, SX, and DX through via plugs VI surrounded by an insulating layer 221. The transfer transistors TX, the logic transistors RX, SX, and DX and the interconnection layer 20 may be configured to process electrical signals, which are generated in the photoelectric conversion regions 110. The wires 212 and 213 may be provided in interlayered insulating layers 222 and 223, which are stacked on the first surface 100a of the semiconductor substrate 100. In some exemplary embodiments, the wires 212 and 213 may be arranged independent of the arrangement of the photoelectric conversion regions 110. For example, the wires 212 and 213 may be provided to cross over the photoelectric conversion regions 110.

The photoelectric conversion regions 110 may be provided in the pixel regions PX, respectively. The photoelectric conversion regions 110 may be doped to have a conductivity type (e.g., a second conductivity type or an n-type conductivity) that is different from that of the semiconductor substrate 100. In some exemplary embodiments, the photoelectric conversion regions 110 may be provided to be adjacent to the second surface 100b of the semiconductor substrate 100 and be spaced apart from the first surface 100a in the third direction D3. In each of the photoelectric conversion regions 110, there may be a difference in doping concentration between two vertically-separated regions adjacent to the first and second surfaces 100a and 100b, respectively. Thus, a potential gradient of each of the photoelectric conversion regions 110 may not vanish between the first surface 100a of the semiconductor substrate 100 and the second surface 100b.

The semiconductor substrate 100 and the photoelectric conversion regions 110 may constitute photodiodes. In other words, since the semiconductor substrate 100 and the photoelectric conversion region 110 have different conductivity types (i.e., the first and second conductivity types), the semiconductor substrate 100 and the photoelectric conversion region 110 may constitute a p-n junction and may serve as a photodiode. In the case where light is incident into the photoelectric conversion region 110 of the photodiodes, photocharges may be generated and stored in proportion to an intensity of the incident light.

The optically-transparent layer 30 may include color filters 303 and micro lenses 307. The optically-transparent layer 30 may be configured to concentrate light, which is incident from the outside, onto the photoelectric conversion layer 10. The optically-transparent layer 30 may also be configured to perform a filtering process on the light.

Color filters 303 and micro lenses 307 may be placed on the second surface 100b of the semiconductor substrate 100. The color filters 303 may be provided on the pixel regions PX, respectively. The micro lenses 307 may be provided on the color filters 303, respectively. A first planarization layer 301 may be provided between the second surface 100b of the semiconductor substrate 100 and the color filters 303, and a second planarization layer 305 may be provided between the color filters 303 and the micro lenses 307.

Each of the color filters 303 may be or include one of green, red, and blue filters. In certain exemplary embodiments, each of the color filters 303 may be or include one of cyan, magenta, and yellow filters.

Each of the micro lenses 307 may have a convex shape, allowing incident light to be concentrated on a corresponding one of the pixel regions PX. When viewed in a plan view, each of the micro lenses 307 may be overlapped with a corresponding one of the photoelectric conversion regions 110.

With reference to FIGS. 4A and 4B, the first device isolation layer 101, i.e., the first portion P1 and/or second portion P2, may be provided to penetrate the semiconductor substrate 100 from the first surface 100a to the second surface 100b, when viewed in a vertical cross-section. That is, the first device isolation layer 101 may completely pass through the semiconductor substrate 100. In some exemplary embodiments, the first device isolation layer 101 may have a length that is substantially equal to or larger than a vertical thickness of the semiconductor substrate 100. The first device isolation layer 101 may have a gradually decreasing width in a direction from the first surface 100a toward the second surface 100b. For example, the first device isolation layer 101 may have a first width W1 at a level near the first surface 100a and may have a second width W2, which is smaller than the first width W1, at a level near the second surface 100b.

Since the first device isolation layer 101 may be formed by etching and deposition process, it may have smooth side surfaces. This may make it possible to prevent irregular reflection from occurring.

Referring to FIG. 4A, when viewed in a sectional view taken in the second direction D2, each of the second portions P2 of the first device isolation layer 101 may be inclined at an angle to the first or second surface 100a or 100b. The second portion P2 of the first device isolation layer 101 may penetrate the semiconductor substrate 100 slantingly from the first surface 100a to the second surface 100b. A first virtual line VL1 may be defined as an imaginary line passing through centers of top and bottom surfaces 400, 402, i.e., the top and bottom cross-sections, of the second portion P2 of the first device isolation layer 101. An extension direction of the first virtual line VL1 may not be parallel to a direction (hereinafter, a third direction D3) that is substantially normal to the first surface 100a of the semiconductor substrate 100. An angle between the first virtual line VL1 and the first surface 100a of the semiconductor substrate 100 may be a first angle θ1 which is not 90°. As an example, the first angle θ1 may range from about 70° to about 89°, i.e., within a few degrees of 70° or 89°, as for example, 69° or 88°, respectively.

Referring to FIG. 4B, when viewed in a sectional view taken in the first direction D1, each of the first portions P1 of the first device isolation layer 101 may have a vertically extending shape. A second virtual line VL2 may be defined as an imaginary line passing through centers of bottom and top surfaces of the first portion P1 of the first device isolation layer 101. An extension direction of the second virtual line VL2 may be parallel to the direction (i.e., the third direction D3) that is substantially normal to the first surface 100a of the semiconductor substrate 100. An angle between the second virtual line VL2 and the first surface 100a of the semiconductor substrate 100 may be a second angle θ2. The second angle θ2 may be substantially equal to 90°, i.e., within a few degrees of 90°.

With reference to FIGS. 4A and 4B, when viewed in a sectional view, the second device isolation layer 103 may have a gradually decreasing width in a direction from the first surface 100a of the semiconductor substrate 100 toward the second surface 100b. A bottom surface of the second device isolation layer 103 may be spaced apart from the photoelectric conversion regions 110 in the vertical direction. A depth of the second device isolation layer 103 may be smaller than that of the first device isolation layer 101. In certain exemplary embodiments, the first device isolation layer 101 and the second device isolation layer 103 may be connected to each other, thereby forming a single body.

With reference to FIGS. 3, 4A, and 4B, the transfer transistor TX may be provided on the first active pattern ACT1 of each of the pixel regions PX. The transfer gate TG and the floating diffusion region FD may be provided on or in the first active pattern ACT1. The transfer gate TG may be provided on the first active pattern ACT1. The transfer gate TG may include a lower portion, which is inserted into the semiconductor substrate 100, and an upper portion, which is connected to the lower portion and is formed to protrude above the first surface 100a of the semiconductor substrate 100. A gate dielectric layer GI may be interposed between the transfer gate TG and the semiconductor substrate 100. The floating diffusion region FD may be formed in a region of the first active pattern ACT1 that is located at a side of the transfer gate TG. The floating diffusion region FD may be doped to have the second conductivity type (e.g., the n-type) that is different from that of the semiconductor substrate 100.

The drive transistor DX and the selection transistor SX may be provided on the second active pattern ACT2 of each of the pixel regions PX. The reset transistor RX may be provided on the third active pattern ACT3 of each of the pixel regions PX. A drive gate SFG and a selection gate SG may be provided on the second active pattern ACT2, and a reset gate RG may be provided on the third active pattern ACT3. The gate dielectric layer GI may be interposed between each of the drive, selection, and reset gates SFG, SG, and RG and the semiconductor substrate 100. Impurity regions DR may be provided in upper regions of the active patterns ACT2 and ACT3, which are located at both sides of each of the drive, selection, and reset gates SFG, SG, and RG. For example, the impurity regions DR may be doped to have the second conductivity type (e.g., the n-type) that is different from that of the semiconductor substrate 100.

Figure 5A:
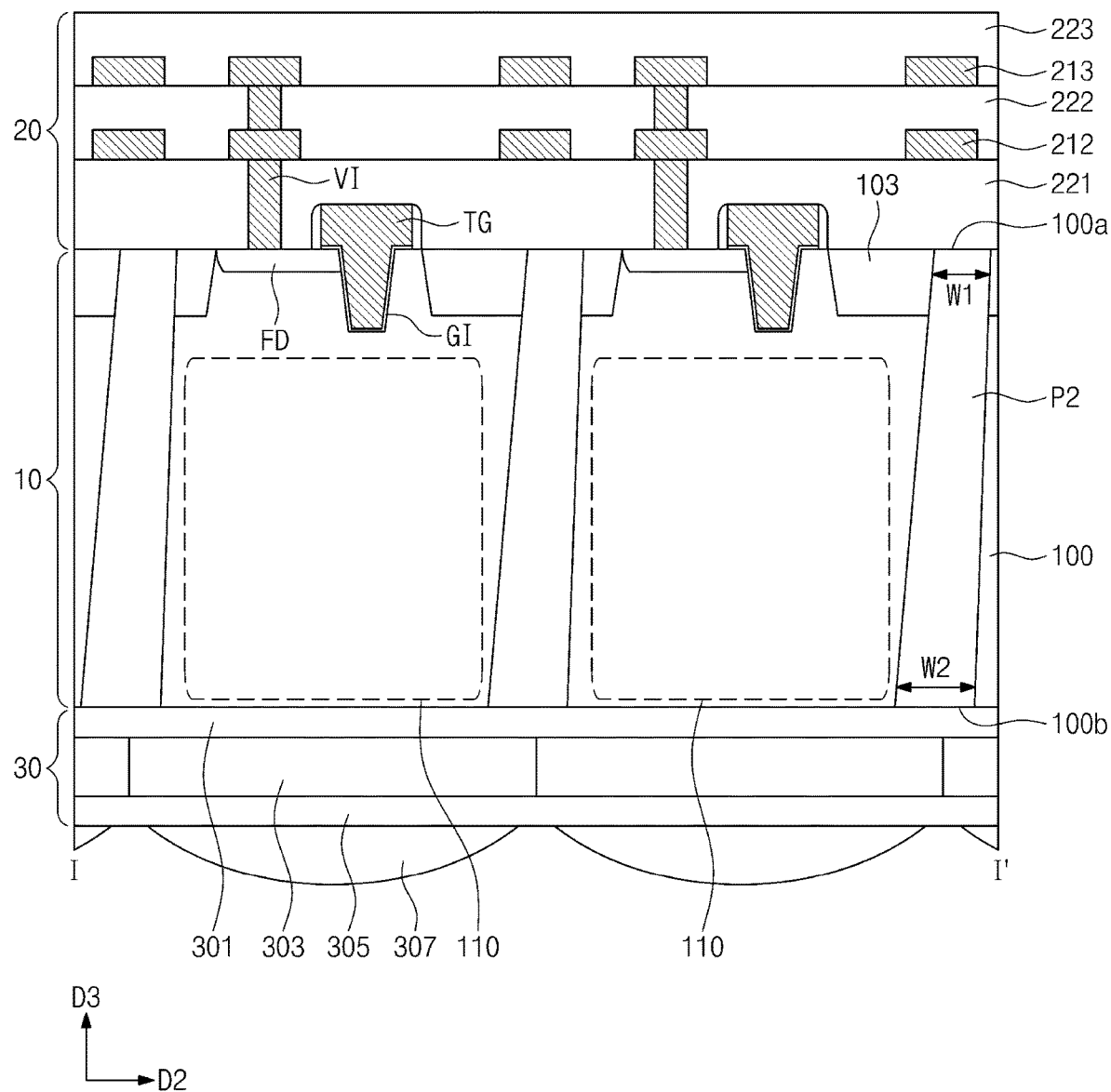
FIGS. 5A, 5B, 6A, and 6B are sectional views of image sensors according to an exemplary embodiment.
Figure 5B:
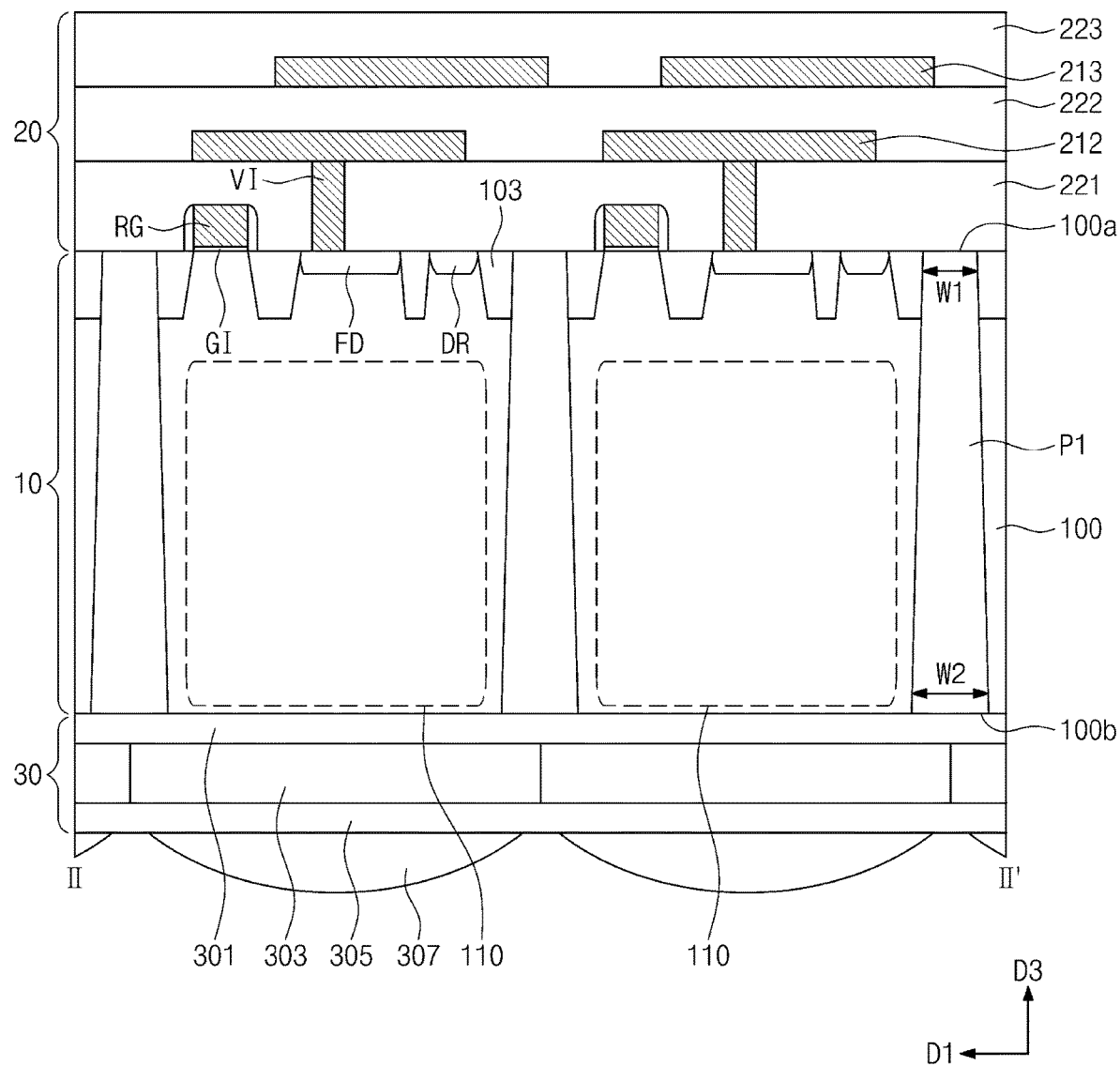
Figure 6A:
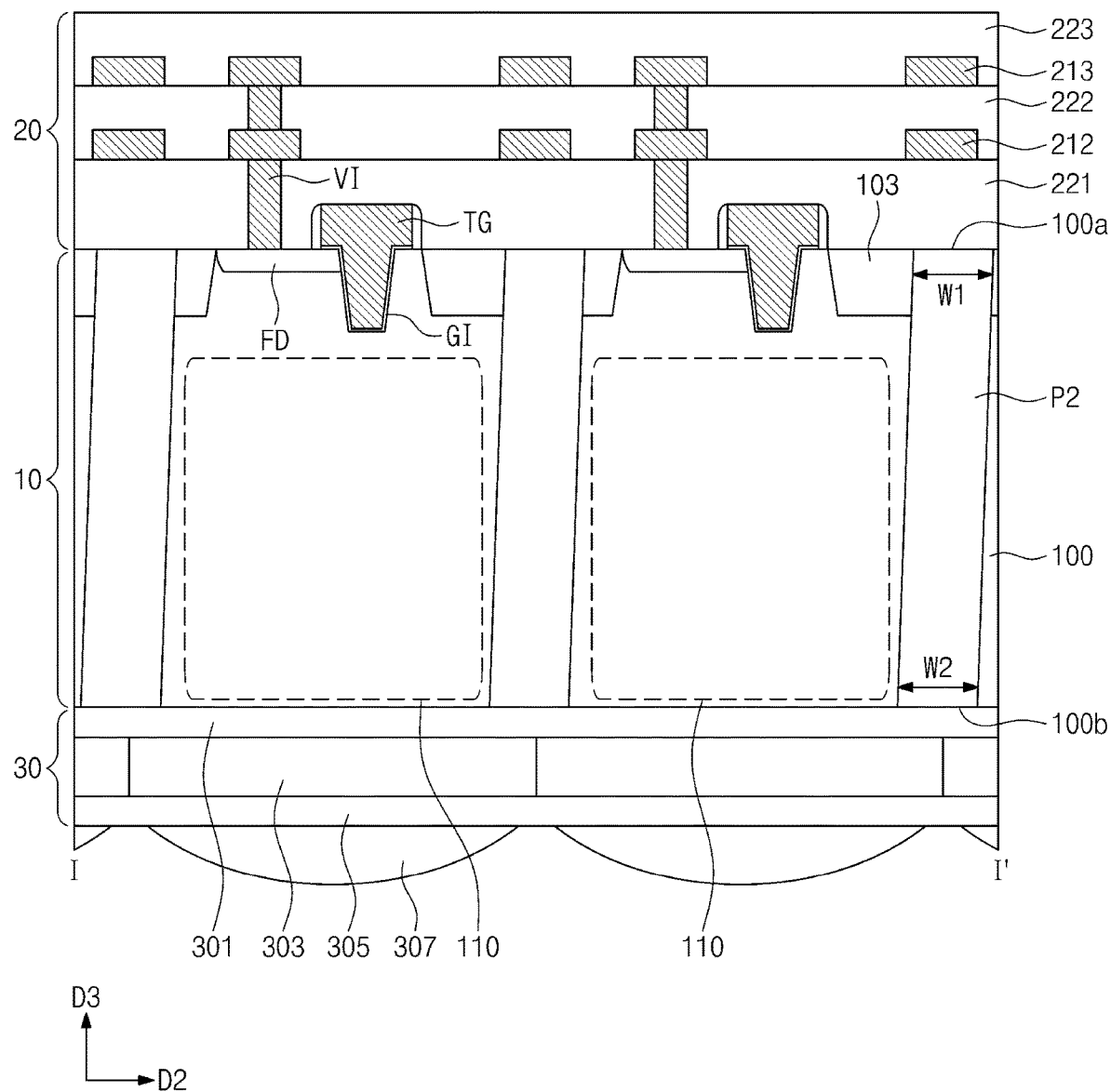
Figure 6B:
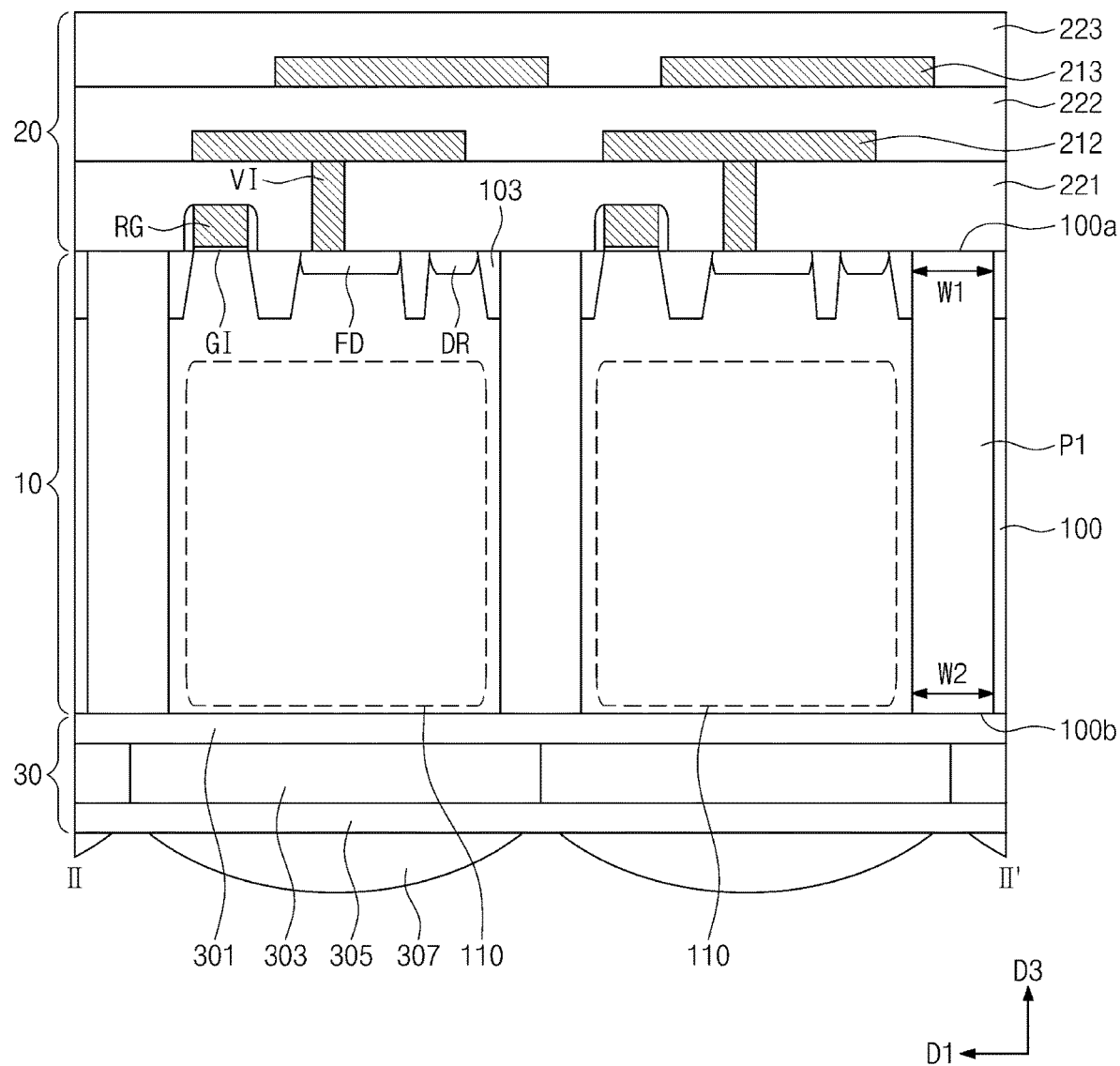

FIGS. 5A, 5B, 6A, and 6B are sectional views of image sensors according to an exemplary embodiment. For example, FIGS. 5A and 6A are sectional views taken along line I-I' of FIG. 3, and FIGS. 5B and 6B are sectional views taken along line II-II' of FIG. 3. In an exemplary embodiment, an element described above with reference to FIGS. 3, 4A, and 4B may be identified by a similar or identical reference number without repeating an overlapping description thereof.

Referring to FIGS. 3, 5A, and 5B, a width of the first portion P1 and/or the second portion P2 of first device isolation layer 101 may increase gradually in a direction from the first surface 100a toward the second surface 100b. For example, the first portion P1 and/or the second portion P2 of first device isolation layer 101 may have a first width W1 at a level near the first surface 100a and may have a second width W2, which is larger than the first width W1, at a level near the second surface 100b.

Referring to FIGS. 3, 6A, and 6B, a width of the first portion P1 and/or the second portion P2 of first device isolation layer 101 may remain constant, regardless of depth. For example, the first portion P1 and/or the second portion P2 of first device isolation layer 101 may have a first width W1 at a level near the first surface 100a and may have a second width W2, which is substantially equal to the first width W1, at a level near the second surface 100b.

Figure 7A:
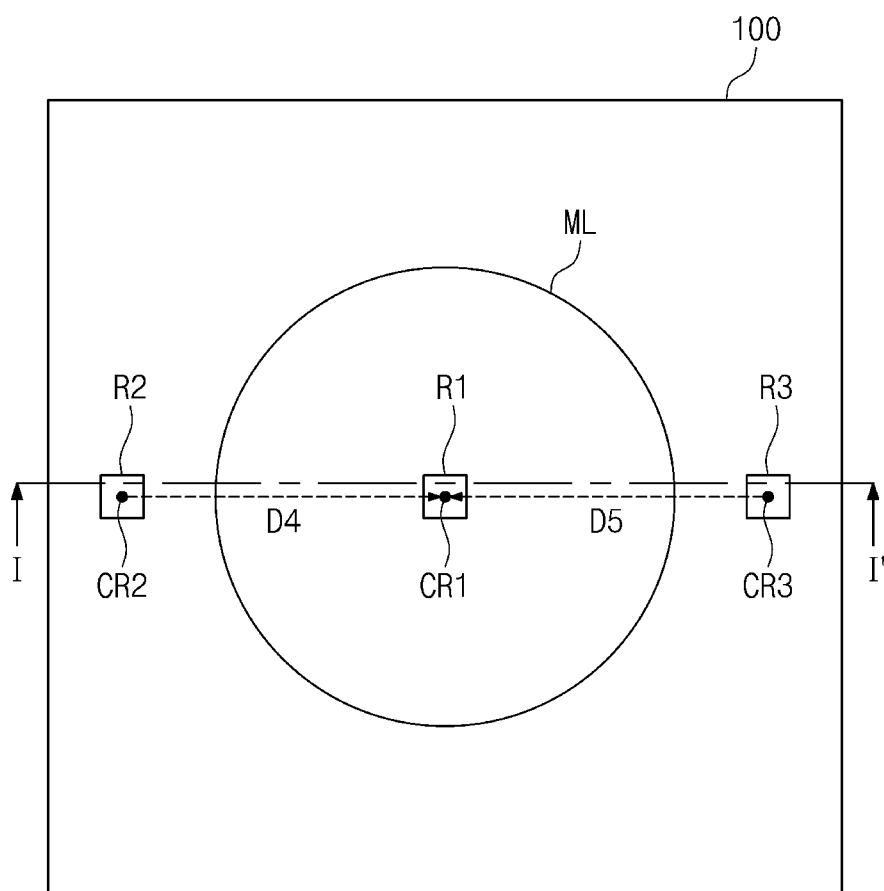
FIG. 7A is a plan view of an image sensor according to an exemplary embodiment.
Figure 7A:
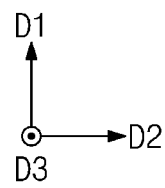
Figure 7B:
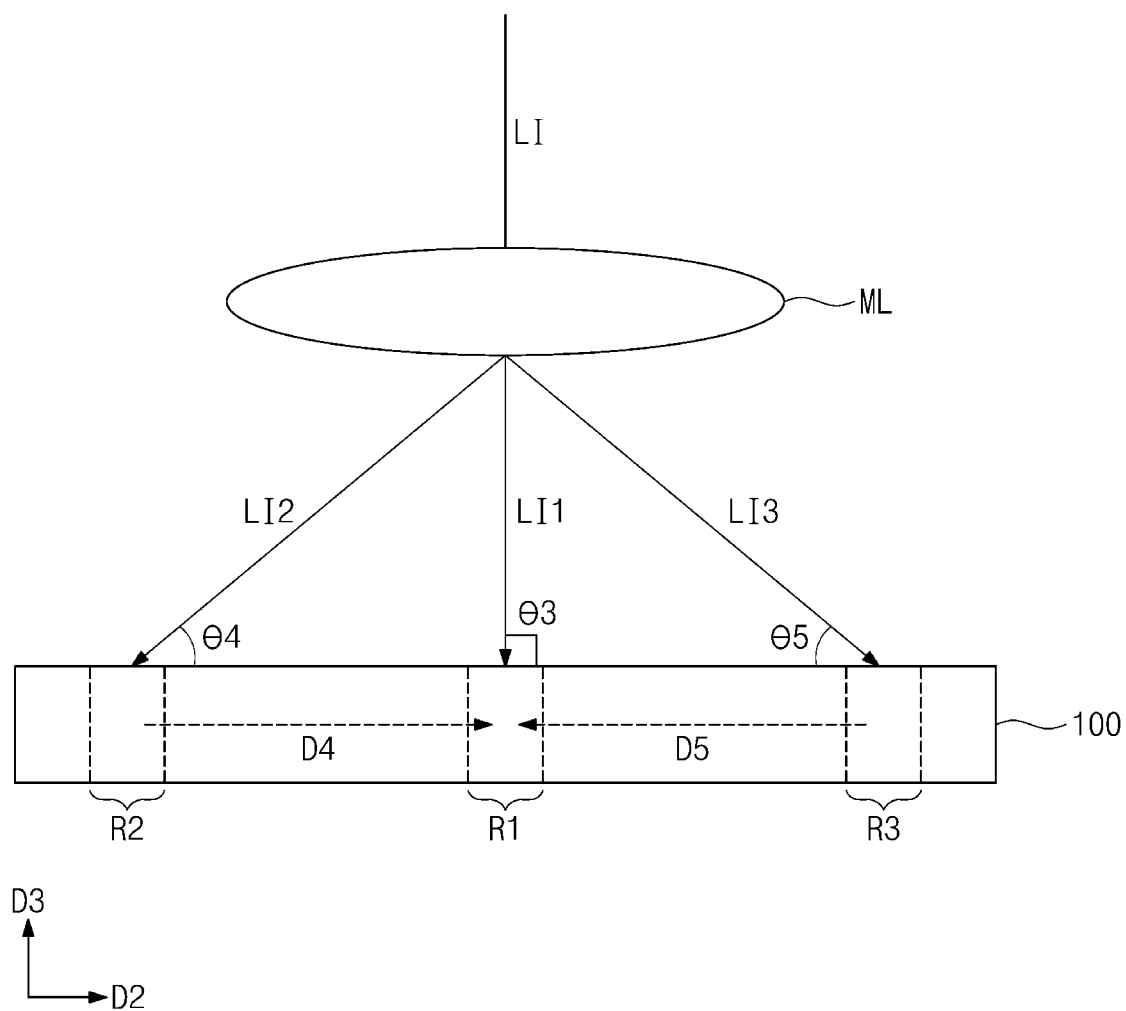
FIG. 7B is a sectional view taken along line I-I' of FIG. 7A.

FIG. 7A is a plan view of an image sensor according to an exemplary embodiment, and FIG. 7B is a sectional view taken along line I-I' of FIG. 7A.

Referring to FIGS. 7A and 7B, an image sensor chip may further include a module lens ML, which is provided over the semiconductor substrate 100. When viewed in a plan view, the module lens ML may be aligned to a center region of the semiconductor substrate 100. An active pixel sensor array with pixel regions may be provided on the semiconductor substrate 100, similar to described with reference to FIGS. 1 to 6B.

In some exemplary embodiments, the semiconductor substrate 100 may include a first region R1, a second region R2, and a third region R3. The first region R1 may be located at a center region of the semiconductor substrate 100, and the second region R2 and the third region R3 may be spaced apart from the center region of the semiconductor substrate 100. The center region (e.g., the first region R1) of the semiconductor substrate 100 may be spaced apart from the second region R2 in a fourth direction D4. For example, a center region CR1 of the first region R1 may be spaced apart from a center region CR2 of the second region R2 in the fourth direction D4. Furthermore, the center region (e.g., the first region R1) of the semiconductor substrate 100 may be spaced apart from the third region R3 in a fifth direction D5. For example, the center region CR1 of the first region R1 may be spaced apart from a center region CR3 of the third region R3 in the fifth direction D5.

Light LI, which is incident through the module lens ML, may be incident to the active pixel sensor array of the semiconductor substrate 100. For example, a portion (hereinafter, a first light LI1) of the light LI may be incident to the first region R1 at a first incident angle θ3 that is substantially a right angle, i.e., within a few degree of 90°. This is because the first region R1 is located at the center region of the semiconductor substrate 100. A portion (hereinafter, a second light LI2) of the light LI may be incident to the second region R2 at a second incident angle θ4 that is less than the first incident angle θ3. This is because the second region R2 is spaced apart from the center region of the semiconductor substrate 100. A portion (hereinafter, a third light LI3) of the light LI may be incident to the third region R3 at a third incident angle θ5 that is less than the first incident angle θ3.

According to an exemplary embodiment, the structure of the first device isolation layer 101 may be deformed depending on a distance from the center of the semiconductor substrate 100. For example, the greater the distance from the center of the semiconductor substrate 100, the larger the structural deformation of the first device isolation layer 101. Here, the structural deformation of the first device isolation layer 101 may be quantitated through geometric comparison with the first device isolation layer 101 that is located at the center of the semiconductor substrate 100. For example, the first angle θ1 of FIG. 4A may be one of such structural features of the first device isolation layer 101, but this is not limiting.

In some exemplary embodiments, the structural deformation of the first device isolation layer 101 may be substantially dependent on the distance from the center of the semiconductor substrate 100 but may be substantially independent of direction relative to the center of the semiconductor substrate 100. This means that, on each of concentric circles with the same center (i.e., the center of the semiconductor substrate 100), the structural deformation of the first device isolation layer 101 may occur in the same manner. For example, an angle between a side surface of the portion of the first device isolation layer and the first surface is dependent on a distance from the center of the semiconductor substrate and is independent of a direction relative to the center of the semiconductor substrate.

As described above, in the case where the module lens ML is used as illustrated in FIGS. 7A and 7B, the incidence angle of the incident light may vary depending on the distance from the center of the semiconductor substrate 100. However, in the case where the structural deformation of the first device isolation layer 101 is dependent on the distance from the center of the semiconductor substrate 100, it may be possible to suppress or cancel technical difficulties resulting from a change in the incidence angle of the incident light. This will be described with reference to FIGS. 8A to 8C.

Figure 8A:
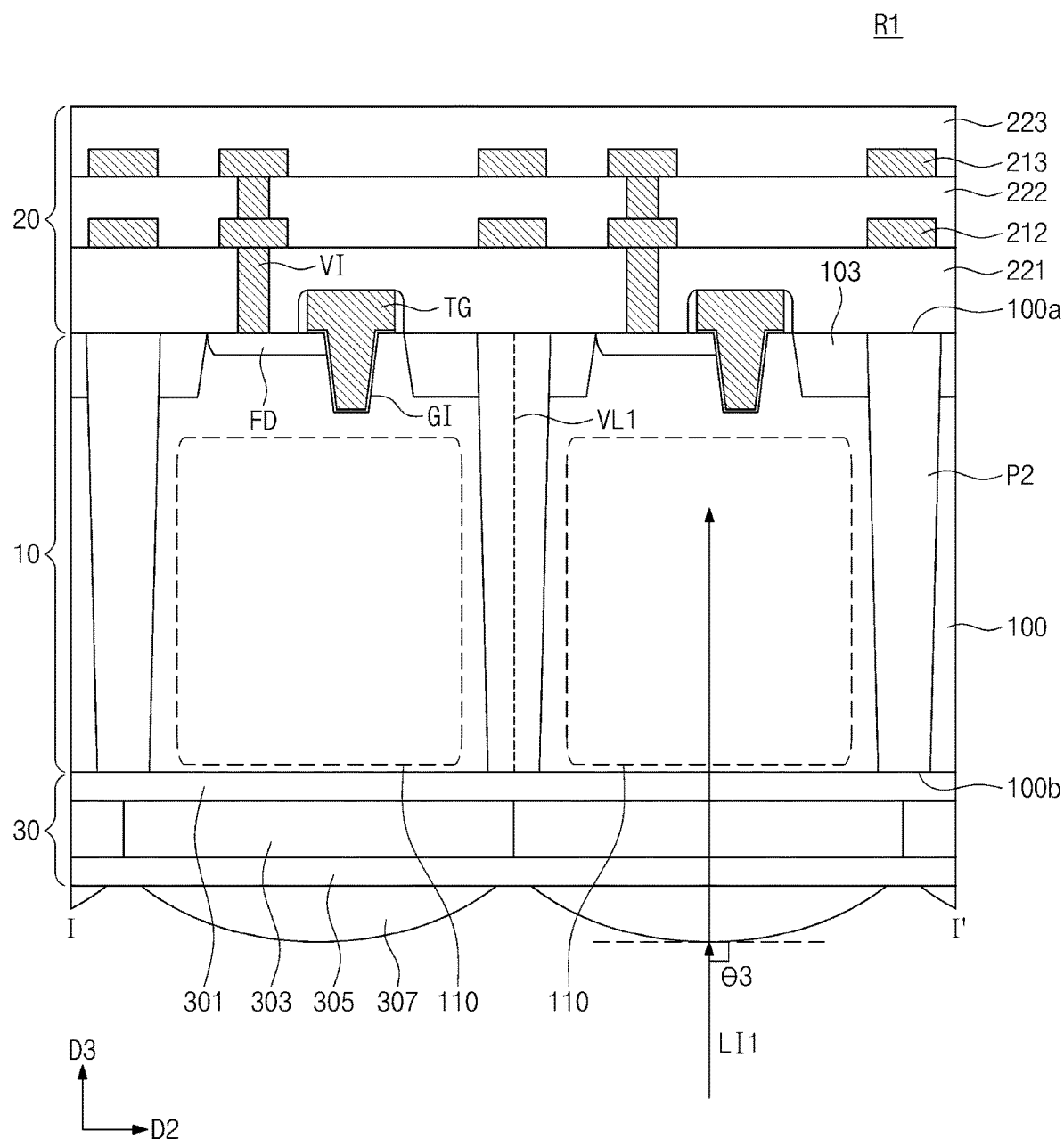
FIGS. 8A, 8B, and 8C are sectional views illustrating an image sensor according to an exemplary embodiment.
Figure 8B:
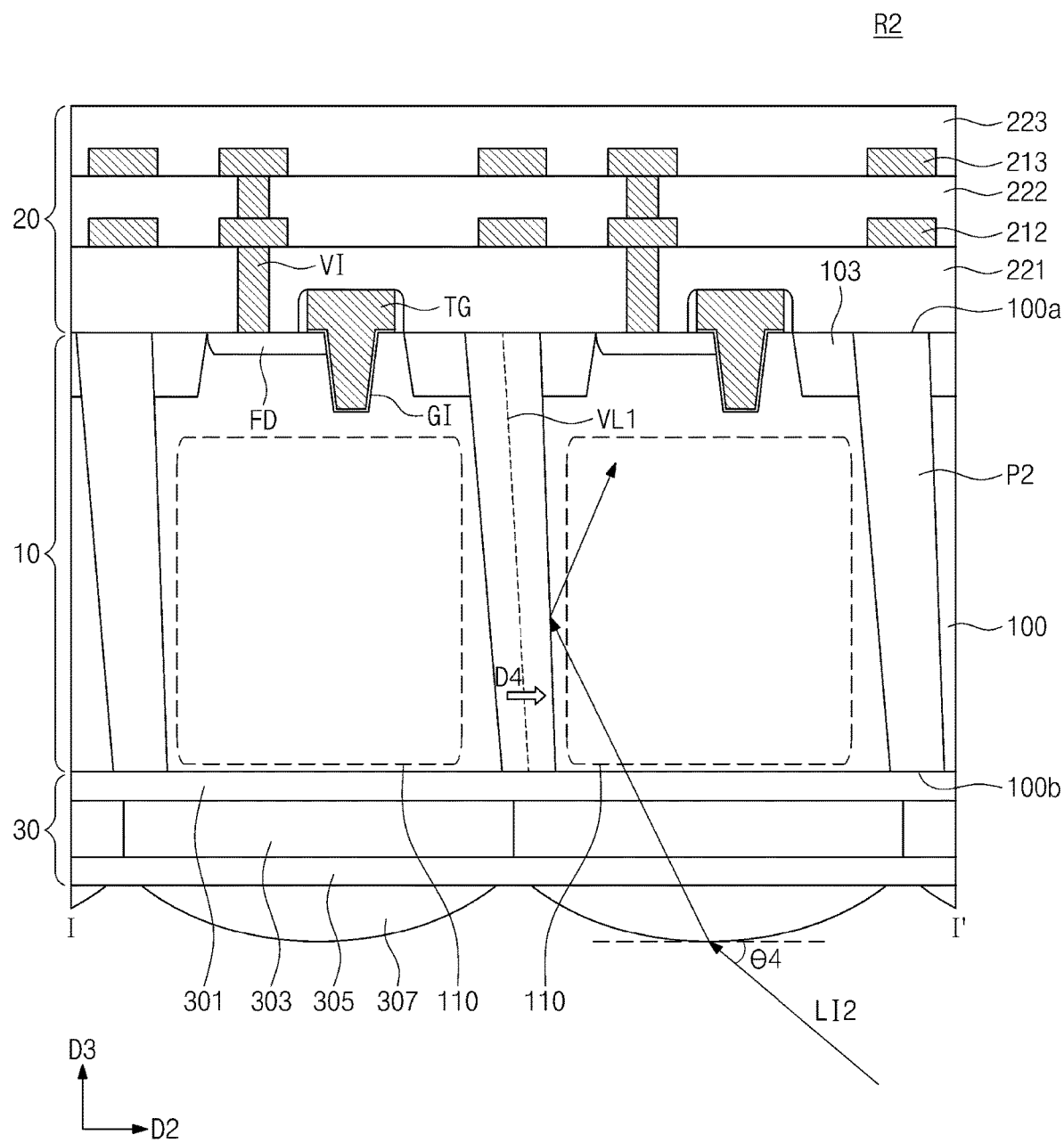
Figure 8C:
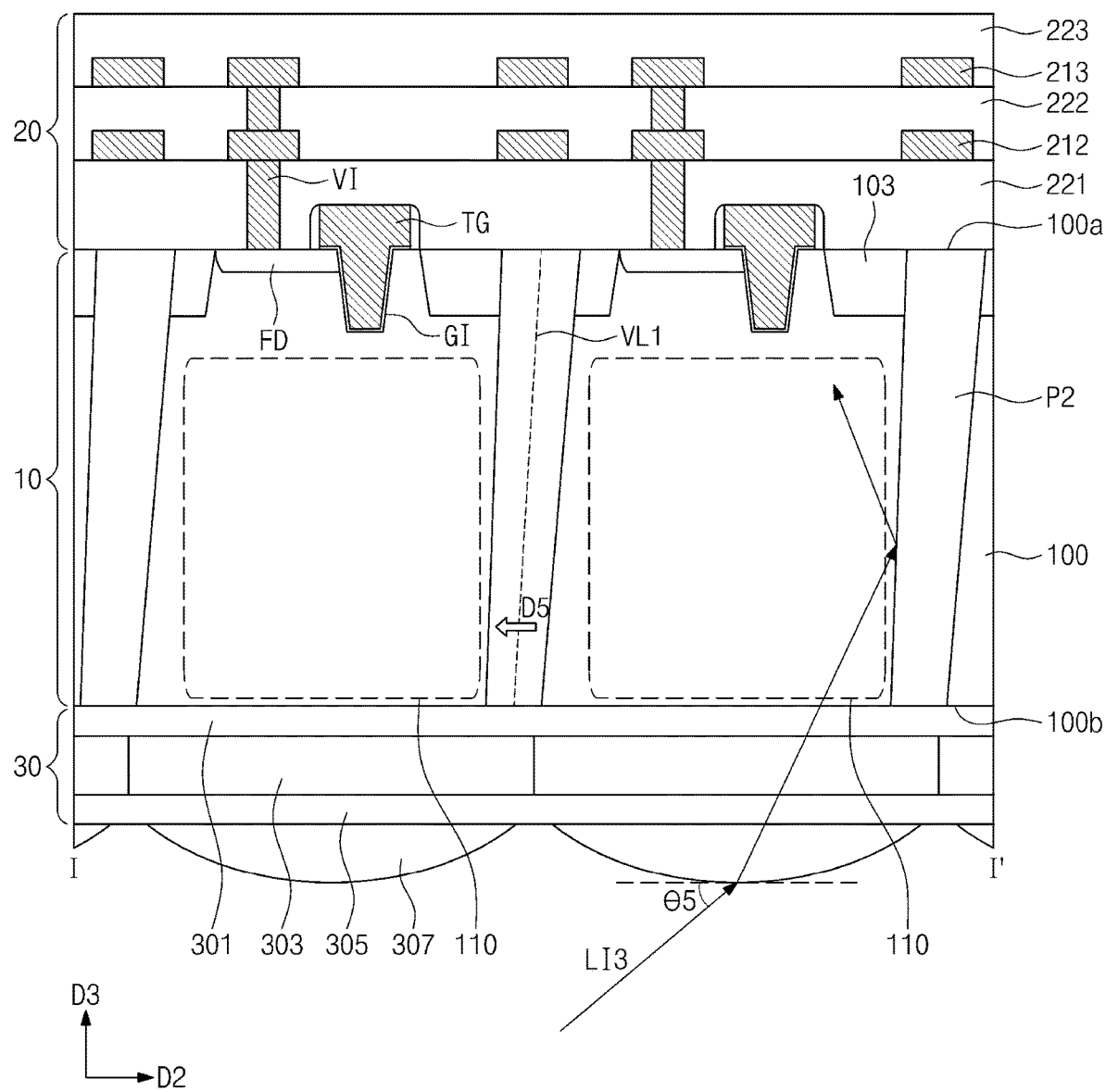

FIGS. 8A to 8C are sectional views illustrating an image sensor according to an exemplary embodiment. FIGS. 8A to 8C are sectional views of the first to third regions, respectively, which are taken along line I-I' of FIG. 7A. In an exemplary embodiment, an element described above with reference to FIGS. 3, 4A, and 4B may be identified by a similar or identical reference number without repeating an overlapping description thereof.

Referring to FIGS. 3 and 8A, the second portion P2 of the first device isolation layer 101 of the first region R1 may have a vertically extending structure. An extension direction of the first virtual line VL1 passing through a center of the second portion P2 may be parallel to a direction (i.e., the third direction D3) that is normal to the first surface 100a of the semiconductor substrate 100. As described above with reference to FIGS. 7A and 7B, the first light LI1 may be incident to the first region R1 at the first incident angle θ3 of about 90°. Since the first light LI1 is incident to the photoelectric conversion regions 110 of the first region R1 at the right angle, light absorption efficiency may be relatively high at the photoelectric conversion region 110 of the first region R1.

Referring to FIGS. 3 and 8B, the second portion P2 of the first device isolation layer 101 of the second region R2 may be provided to penetrate the semiconductor substrate 100 from the first surface 100a to the second surface 100b and may be inclined in the fourth direction D4. Here, the fourth direction D4 may be one of the directions that extend radially outward from a central axis extending through the center of the semiconductor substrate 100 to edge portions of the semiconductor substrate 100. As described above with reference to FIGS. 7A and 7B, the second light LI2 may be incident to the second region R2 at the second incident angle θ4 that is less than 90°. The second light LI2 incident into the photoelectric conversion region 110 may be totally reflected by the first device isolation layer 101. This may make it possible to increase light absorption efficiency of the photoelectric conversion region 110 of the second region R2.

Referring to FIGS. 3 and 8C, the second portion P2 of the first device isolation layer 101 of the third region R3 may be provided to penetrate the semiconductor substrate 100 from the first surface 100a to the second surface 100b and may be inclined in the fifth direction D5. Here, the fifth direction D5, which is used to represent the third region R3, may be another of the directions that are radially outward from the center of the semiconductor substrate 100. As described above with reference to FIGS. 7A and 7B, the third light LI3 may be incident to the third region R3 at the third incident angle θ5 that is less than 90°. The third light LI3 incident into the photoelectric conversion region 110 may be totally reflected by the first device isolation layer 101. This may make it possible to increase light absorption efficiency of the photoelectric conversion region 110 of the third region R3.

According to an exemplary embodiment, an image sensor may include a device isolation layer, which is used to define pixel regions. The device isolation layer may be provided to penetrate a substrate in a vertical direction but may be slightly inclined relative to a top surface of the substrate. This structure of the device isolation layer may make it possible to increase light absorption efficiency in a photoelectric conversion region of each pixel region.

What is claimed is:

1. An image sensor comprising:
   a semiconductor substrate having a first surface and a second surface facing each other; and
   a first device isolation layer which is provided in the semiconductor substrate to define pixel regions of the semiconductor substrate, and comprises a first portion extending in a first direction and a second portion extending in a second direction, the first direction and the second direction crossing each other,
   wherein the first portion and the second portion are provided to surround the pixel regions, respectively,
   the first portion comprises a structure inclined relative to the first surface, the structure comprising:
      two first sidewalls which penetrate the semiconductor substrate from the first surface to the second surface, and
      an insulation material disposed at least in a space formed by the two first sidewalls, the first surface, and the second surface,
   wherein each of the two first sidewalls is slanted in a same direction and inclined toward the first surface,
   a first angle is formed between the first surface and one first sidewall among the two first sidewalls, by an inclination of the one first sidewall toward the first surface,
   a second angle is formed between the first surface and another first sidewall among the two first sidewalls, by an inclination of the another first sidewall toward the first surface,
   the first angle is different from the second angle, and
   each of the first angle and the second angle is less than 90°.

2. The image sensor of claim 1, wherein, when viewed in a sectional view taken in the second direction, an extension direction of a virtual line passing through a center of a bottom surface and a center of a top surface of the first portion is inclined to a direction that is normal to the first surface of the semiconductor substrate.

3. The image sensor of claim 2, wherein, when viewed in the sectional view taken in the second direction, the virtual line is inclined toward the first surface with an angle from about 70° to about 89°.

4. The image sensor of claim 1, further comprising a photoelectric conversion region provided in each of the pixel regions,
wherein the semiconductor substrate has a first conductivity type, and
the photoelectric conversion region of each of the pixel regions has a second conductivity type different from the first conductivity type.

5. The image sensor of claim 1, wherein the second portion extends from the first surface toward the second surface in a direction that is substantially normal to the first surface.

6. The image sensor of claim 1, further comprising:
a second device isolation layer provided in the semiconductor substrate and adjacent to the first surface, the second device isolation layer defining a first active pattern and a second active pattern in each of the pixel regions;
a transfer transistor provided on the first active pattern; and
a logic transistor provided on the second active pattern.

7. The image sensor of claim 1, further comprising:
color filters provided on the second surface of the semiconductor substrate; and
micro lenses provided on, the color filters.

8. An image sensor comprising:
a semiconductor substrate having a first surface and a second surface opposing one another and pixel regions formed between the first surface and the second surface; and
a first device isolation layer which extends in the semiconductor substrate between the first surface and the second surface and defines the pixel regions by surrounding each of the pixel regions, the first device isolation layer having a portion comprising a structure inclined toward the first surface,
the structure comprising:
two first sidewalls which penetrate the semiconductor substrate from the first surface to the second surface, and
an insulation material disposed at least in a space formed by the two first sidewalls, the first surface, and the second surface,
wherein each of the two first sidewalls is slanted in a same direction and inclined toward the first surface,
a first angle is formed between the first surface and one first sidewall among the two first sidewalls, by an inclination of the one first sidewall toward the first surface,
a second angle is formed between the first surface and another first sidewall among the two first sidewalls, by an inclination of the another first sidewall toward the first surface,
the first angle is different from the second angle, and
each of the first angle and the second angle is less than 90°.

9. The image sensor of claim 8, wherein the semiconductor substrate has a central axis extending through a central portion of the semiconductor substrate between the first surface and the second surface, and
the portion of the first device isolation layer extends from the first surface in an outward direction with respect to the central axis.

10. The image sensor of claim 9, wherein the portion of the first device isolation layer has a top cross-section at the first surface and a bottom cross-section at the second surface, and
a center of the top cross-section is disposed closer to the central axis than a center of the bottom cross-section.

11. The image sensor of claim 10, wherein a virtual line through the center of the top cross-section and the center of the bottom cross-section is inclined toward the first surface, and
an angle between the virtual line and the first surface is from about 70° to about 89°.

12. The image sensor of claim 8, wherein the portion of the first device isolation layer extends on the first surface in a first direction,
the first device isolation layer includes another portion which extends on the first surface in a second direction which crosses the first direction, and
the portion and the another portion together form a boundary surrounding an outer region of each of the pixel regions, respectively.

13. The image sensor of claim 1, wherein the second portion comprises two second sidewalls which penetrate the semiconductor substrate from the first surface to the second surface and the insulation material disposed at least in a space formed by the two second sidewalls, the first surface, and the second surface, and
the two second sidewalls are slanted toward each other and inclined toward the first surface with an angle of inclination, respectively, with respect to the first surface.

14. The image sensor of claim 13, wherein the angle of inclination between each of the two second sidewalls and the first surface is less than 90°, respectively.

15. The image sensor of claim 1, wherein a width of the structure gradually decreases from the first surface to the second surface, and
a geometry of a cross-section of the structure in a direction along the first surface is changed in a direction toward the second surface due to a difference in the inclination between the two first sidewalls with respect to the first surface.

16. The image sensor of claim 1, wherein the insulation material comprises silicon.

17. An image sensor comprising:
a semiconductor substrate having a first surface and a second surface facing each other; and
a first device isolation layer which is provided in the semiconductor substrate to define pixel regions of the semiconductor substrate, and comprises a first portion extending in a first direction and a second portion extending in a second direction, the first direction and the second direction crossing each other, wherein
the first portion and the second portion are provided to surround the pixel regions, respectively,
the first portion is inclined relative to the first surface,
the first portion has two opposite sidewalls which penetrate the semiconductor substrate from the first surface to the second surface,
each of the two opposite sidewalls is slanted in a same direction and inclined toward the first surface,
a first angle is formed between the first surface and a first sidewall of the two opposite sidewalls, by an inclination of the first sidewall toward the first surface, a second angle is formed between the first surface and a second sidewall of the two opposite sidewalls, by an inclination of the second sidewall toward the first surface, and the first angle is different from the second angle.

18. The image sensor of claim 17, wherein each of the first angle and the second angle is less than 90°.

19. The image sensor of claim 17, wherein a width of the first portion gradually changes from the first surface to the second surface, and a geometry of a cross-section of the first portion in a direction along the first surface is changed in a direction toward the second surface due to a difference in the inclination between the two opposite sidewalls with respect to the first surface.

* * * * *